US010672877B2

(12) United States Patent
Joo et al.

(10) Patent No.: US 10,672,877 B2
(45) Date of Patent: Jun. 2, 2020

(54) METHOD OF BOOSTING RON*COFF PERFORMANCE

(71) Applicant: Integrated Device Technology, Inc., San Jose, CA (US)

(72) Inventors: Roberto Aparicio Joo, San Diego, CA (US); Shawn Bawell, Amherst, NH (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/267,840

(22) Filed: Feb. 5, 2019

(65) Prior Publication Data

US 2019/0245048 A1   Aug. 8, 2019

Related U.S. Application Data

(60) Provisional application No. 62/626,942, filed on Feb. 6, 2018.

(51) Int. Cl.
*H01L 29/417* (2006.01)
*H01L 27/088* (2006.01)
*H01L 29/08* (2006.01)
*H01L 29/423* (2006.01)
*H01L 27/12* (2006.01)
*H01L 29/40* (2006.01)
(Continued)

(52) U.S. Cl.
CPC .... *H01L 29/41758* (2013.01); *H01L 23/5226* (2013.01); *H01L 27/088* (2013.01); *H01L 27/1203* (2013.01); *H01L 29/0847* (2013.01); *H01L 29/401* (2013.01); *H01L 29/42376* (2013.01); *H01L 29/66568* (2013.01); *H03K 17/162* (2013.01); *H04B 1/48* (2013.01); *H01L 29/78* (2013.01); *H04B 2001/485* (2013.01)

(58) Field of Classification Search
CPC .................................................. H01L 29/41758
See application file for complete search history.

(56) References Cited

U.S. PATENT DOCUMENTS 6,168,983 B1 * 1/2001 Rumennik ............ H01L 21/266
                                                              438/188
6,207,994 B1 * 3/2001 Rumennik .............. H01L 21/26
                                                              257/339
(Continued)

*Primary Examiner* — Ankur Jain
(74) *Attorney, Agent, or Firm* — Christopher P. Maiorana, PC

(57) ABSTRACT

An apparatus includes one or more field effect transistors configured as a switch. Each of the one or more field effect transistors comprises one or more source diffusions, one or more drain diffusions, and one or more gate fingers. Each of the one or more gate fingers is disposed between a source diffusion and a drain diffusion. A first electrical connection to the one or more source diffusions is made using one or more source electrodes that extend from a first end for a first length along a long axis of the source diffusions. A second electrical connection to the one or more drain diffusions is made using one or more drain electrodes that extend from a second end for a second length along a long axis of the drain diffusions. The first length of the one or more source electrodes and the second length of the one or more drain electrodes are generally selected to avoid juxtaposition of the one or more source electrodes and the one or more drain electrodes.

15 Claims, 7 Drawing Sheets

(51) Int. Cl.
  *H03K 17/16* (2006.01)
  *H01L 23/522* (2006.01)
  *H04B 1/48* (2006.01)
  *H01L 29/66* (2006.01)
  *H01L 29/78* (2006.01)

(56) References Cited

U.S. PATENT DOCUMENTS

| | | | | |
|---|---|---|---|---|
| 8,278,685 B2* | 10/2012 | Takagi | ............ | H01L 21/76898 257/192 |
| 2004/0000676 A1* | 1/2004 | Fujioka | ............ | H01L 23/4824 257/198 |
| 2005/0017296 A1* | 1/2005 | Hoshino | ............ | H01L 21/823871 257/334 |
| 2008/0203440 A1* | 8/2008 | Tsuchiaki | ............ | H01L 29/045 257/255 |
| 2009/0166756 A1* | 7/2009 | Kasahara | ............ | H01L 29/41758 257/390 |
| 2009/0278207 A1* | 11/2009 | Greenberg | ............ | H01L 23/528 257/386 |
| 2012/0235712 A1* | 9/2012 | Yamaji | ............ | H01L 24/05 327/109 |
| 2013/0193412 A1* | 8/2013 | Lee | ............ | H01L 29/66787 257/29 |
| 2014/0239311 A1* | 8/2014 | Kawai | ............ | H01L 29/7783 257/76 |
| 2016/0020207 A1* | 1/2016 | Tsuchiya | ............ | H01L 29/7787 257/401 |
| 2016/0093691 A1* | 3/2016 | Echigoya | ............ | H01L 29/063 257/76 |
| 2016/0133701 A1* | 5/2016 | O hAnnaidh | ............ | H01L 29/42376 257/401 |
| 2017/0104064 A1* | 4/2017 | Aoki | ............ | H01L 29/7786 |
| 2017/0222001 A1* | 8/2017 | Kawano | ............ | H01L 23/66 |
| 2018/0342985 A1* | 11/2018 | Then | ............ | H03F 3/213 |
| 2019/0172806 A1* | 6/2019 | Kurokawa | ............ | H01L 29/0692 |
| 2019/0245048 A1* | 8/2019 | Joo | ............ | H03K 17/102 |
| 2019/0326393 A1* | 10/2019 | Masunaga | ............ | H01L 29/1095 |
| 2020/0105871 A1* | 4/2020 | Glass | ............ | H01L 29/66795 |

* cited by examiner

METHOD OF BOOSTING RON*COFF PERFORMANCE

This application relates to U.S. Provisional Application No. 62/626,942, filed Feb. 6, 2018, which is hereby incorporated by reference in its entirety.

FIELD OF THE INVENTION

The invention relates to radio frequency (RF) switching generally and, more particularly, to a method and/or apparatus for boosting RON*COFF performance.

BACKGROUND

A key metric for radio frequency (RF) switching is RON*COFF performance. RON*COFF is a ratio of how much loss occurs when a radio signal passes through a switch in a conducting (ON) state (e.g., RON, or on-resistance) and how much the radio signal leaks through the switch in a non-conducting (OFF) state (e.g., COFF, or off-capacitance). Low RON*COFF is critical to ensure a switch with low insertion loss (low RON) as well as high isolation (low COFF).

It would be desirable to implement a method and/or apparatus for boosting RON*COFF performance.

SUMMARY

The invention concerns an apparatus comprising one or more field effect transistors configured as a switch. Each of the one or more field effect transistors comprises one or more source diffusions, one or more drain diffusions, and one or more gate fingers. Each of the one or more gate fingers is disposed between a source diffusion and a drain diffusion. A first electrical connection to the one or more source diffusions is made using one or more source electrodes that extend from a first end for a first length along a long axis of the source diffusions. A second electrical connection to the one or more drain diffusions is made using one or more drain electrodes that extend from a second end for a second length along a long axis of the drain diffusions. The first length of the one or more source electrodes and the second length of the one or more drain electrodes are generally selected to avoid juxtaposition of the one or more source electrodes and the one or more drain electrodes.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for boosting RON*COFF performance that may (i) reduce an off-capacitance of a field effect transistor, (ii) pattern source and drain electrodes to avoid juxtaposition of the electrodes, (iii) provide improved isolation in a radio frequency (RF) switch, (iv) reduce radio signal leakage through an RF switch in a non-conducting (OFF) state, and/or (v) be implemented as one or more integrated circuits.

In wireless systems, a front-end module (FEM) provides an interface between an antenna and an RF transceiver. A FEM typically includes power amplifiers, switches, low-noise amplifiers, control circuitry, and passive elements. Wireless infrastructure, time division duplex (TDD) active antenna systems, and small cell base stations can involve switching high power levels (e.g., 35 dBm) at high frequencies (e.g., >2 GHz). The number of RF switch devices per phone has increased with the shift to 4G, or long-term evolution (LTE), and may be expected to grow with the introduction of 5G applications. A majority of the switches going into cellular (or smart) telephones are Silicon on Insulator (SOI). Although RF switches may utilize a variety of technologies, field effect transistor (FET) switches are typically used in cellular applications to lower power demand and extend battery life. In various embodiments, an RF switch is implemented utilizing a FET layout configured to reduce an off-capacitance of the FETs making up the RF switch, provide improved isolation, and reduce radio signal leakage through the RF switch in a non-conducting (OFF) state. In an example, source and drain electrodes of the FETs are patterned to avoid (or minimize) juxtaposition of the electrodes.

Figure 1:
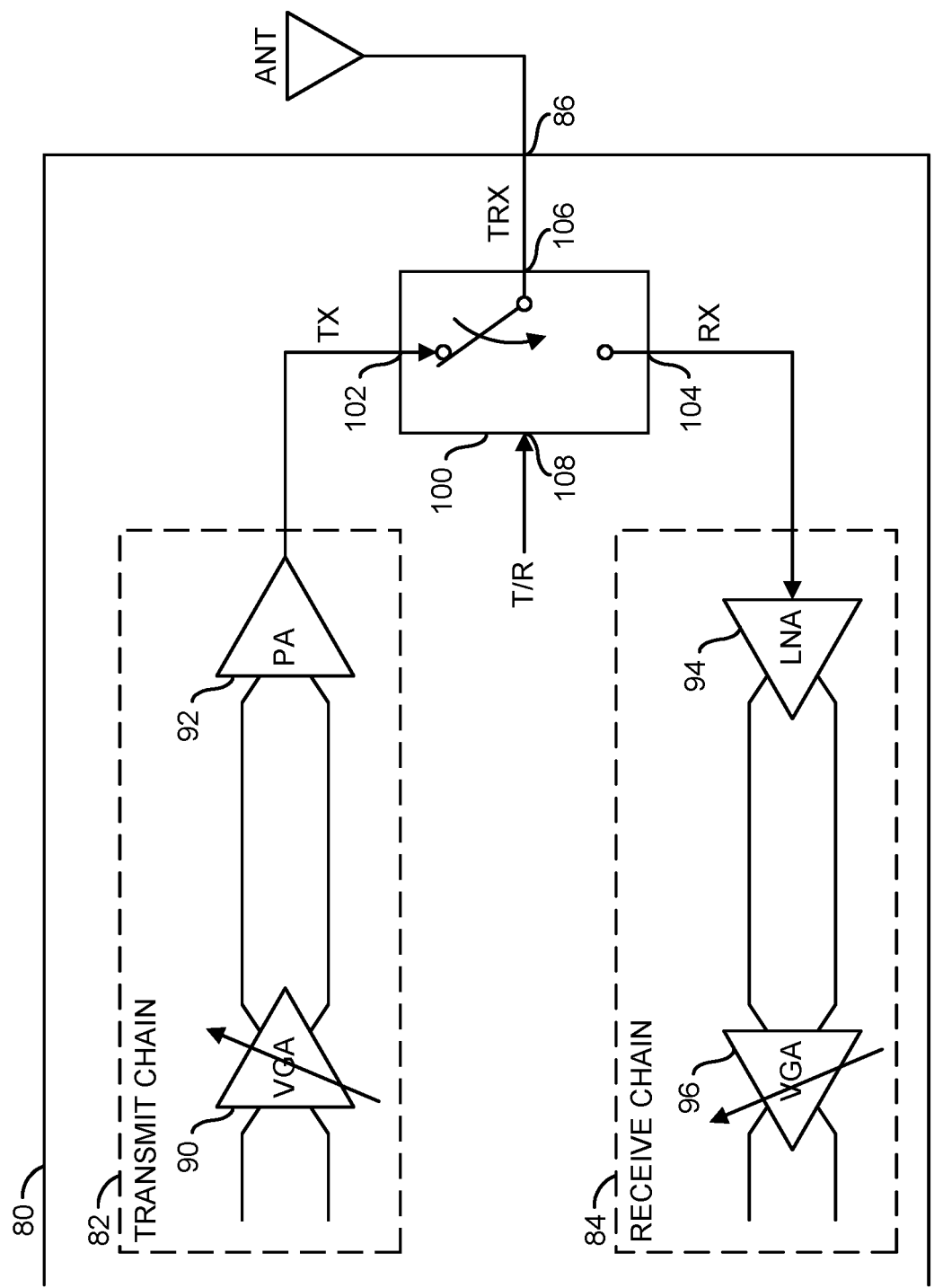
FIG. 1 is a diagram illustrating a transceiver context including an RF switch in accordance with an example embodiment of the invention.

Referring to FIG. 1, a block diagram of a circuit 80 is shown illustrating an example application of a radio frequency (RF) switch in accordance with an embodiment of the invention. In an example embodiment, the circuit 80 may implement a transceiver. A transceiver is capable of both transmitting and receiving signals of a communication channel. In various embodiments, the circuit 80 may be capable of transmitting and receiving radio frequency (RF), microwave, and/or millimeter-wave signals. In various embodiments, the circuit 80 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and portable handheld devices (UEs).

In an example, the circuit 80 may comprise a block (or circuit) 82, a block (or circuit) 84, and an antenna port 86. In an example, the circuit 82 may be implemented as a stand alone transmitter circuit. In another example, the circuit 82 may be implemented as a transmit chain of a transceiver integrated circuit. In an example, the circuit 84 may be implemented as a stand alone receiver circuit. In another example, the circuit 84 may be implemented as a receive chain of the transceiver integrated circuit embodying the transmit chain 82.

In an example, the transmitter or transmit chain 82 may comprise a first (input) amplifier 90 and a second (output) amplifier 92. In an example, the amplifier 90 may be implemented as a variable gain amplifier (VGA) and the amplifier 92 may be implemented as a power amplifier (PA). The VGA amplifier 90 may be coupled, directly or indirectly through other components, to the power amplifier 92. In various embodiments, the circuit 82 may further comprise one or more of additional components (e.g., RF amplifiers, IF amplifiers, RF mixers, digital step attenuators (DSAs), broadband modulators, wideband voltage variable attenuators, etc.), not shown.

In an example, the receive chain 84 may comprise a first (input) amplifier 94 and a second (output) amplifier 96. In an example, the amplifier 94 may be implemented as a low noise amplifier (LNA) and the amplifier 96 may be implemented as a variable gain amplifier (VGA). The LNA 94 may be coupled, directly or indirectly through other components, to the VGA 96. In various embodiments, the circuit 84 may further comprise one or more of additional components (e.g., filters, limiters, RF amplifiers, IF amplifiers, RF mixers, digital step attenuators (DSAs), broadband demodulators, wideband voltage variable attenuators, etc.), not shown.

In an example, the transmitter or transmit chain 82, the receiver or receive chain 84, and the antenna port 86 may be coupled together via a block (or circuit) 100. The circuit 100 generally implements a transmit/receive (T/R) switch in accordance with an example embodiment of the present invention. In an example, the circuit 100 may be implemented as a stand alone integrated circuit. In another example, the circuit 100 may be integrated, along with the transmit chain 82 and the receive chain 84, within a transceiver integrated circuit.

In an example, the circuit 100 may have a first (input) port 102, a second (output) port 104, a third (common) port 106, and a control input 108. The first port may be coupled to an output of the transmitter or transmit chain 82. The second port 104 may be coupled to an input of the receiver or receive chain 84. The common port 106 may be coupled to the antenna port 86. The control input 108 may receive a signal (e.g., T/R). The signal T/R may implement a control signal for switching between a transmit mode where a signal is directed from the first (TX) port 102 to the common (TRX) port 106 and a receive mode where a signal is directed from the common (TRX) port 106 to the second (RX) port 104. In an example, the signal T/R may be implemented as summarized in the following TABLE 1:

TABLE 1

| T/R | TX to TRX | TRX to RX |
| --- | --- | --- |
| LOW | OFF (isolated) | ON |
| HIGH | ON | OFF (isolated) |

The signal T/R may be presented either directly to the input 108 or through a conditioning circuit (e.g., where a clean control signal cannot be guaranteed due to overshoot, undershoot, ringing, etc.).

Figure 2:
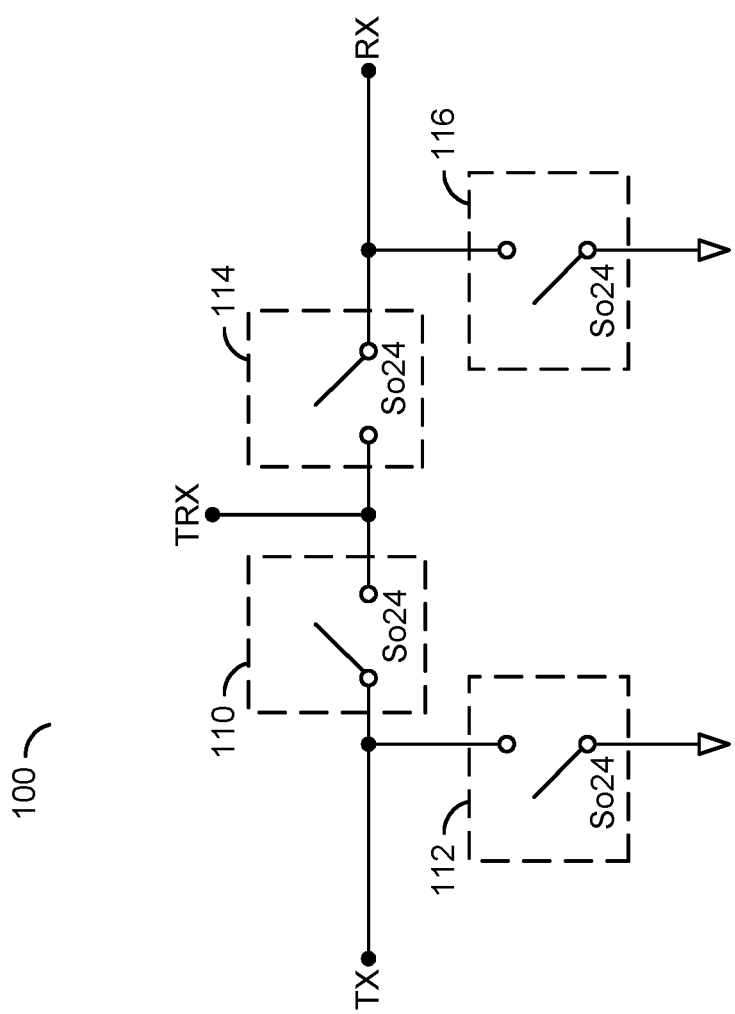
FIG. 2 is a diagram illustrating an example implementation of the RF switch of FIG. 1.

Referring to FIG. 2, a diagram is shown illustrating an example implementation of the circuit 100 of FIG. 1. In an example, the circuit 100 may implement a single-pole double throw (SPDT or SP2T) switch. However, other numbers of poles and/or throws may be implemented accordingly to meet design criteria of particular applications. In an example, the circuit 100 may be implemented as a high-power RF switch utilizing a silicon-on-insulator (SOI) process. However, in other examples, the circuit 100 may be implemented utilizing a CMOS fabrication process on bulk silicon or utilizing any other transistor technology in which terminals of the transistor are in juxtaposition generally.

In an example, the circuit 100 may comprise a series transmit switch 110, a shunt transmit switch 112, a series receive switch 114, and a shunt receive switch 116. In an example, each of the switches 110, 112, 114, and 116 may be implemented by a large number (e.g., 24) of series connected stacked devices. However, other numbers (e.g., 2, 3, 4, 8, etc.) of stacked devices may be used to meet design criteria of a particular application. In various embodiments, each of the switches 110, 112, 114, and 116 may be implemented having a similar number or a different number of stacked devices. In an example, the stack of 24 devices may handle up to a 44 dBm input power. The switch 100 generally occupies a large die area due to the high number of stacked devices. In addition to withstanding high input power in the OFF state, the stacked devices need to provide good isolation (low COFF). With a conventional layout technique, the high number of stacked devices making up the switches 110, 112, 114, and 116 would have negative effects (e.g., through substrate loss and parasitic substrate capacitance due to the large device size and high stacking count). Instead of using the conventional technique, the devices making up the switches 110, 112, 114, and 116 are generally configured (e.g., through source and drain electrode layout) to minimize parasitic source-drain capacitance ($C_{SD}$) to minimize the amount of the input radio signal leaks through the switch in the non-conducting (OFF) state.

In various embodiments, the switches 110, 112, 114, and 116 are used to route signals between an RF input port (e.g., TX), an RF output port (e.g., RX), and an RF common port (e.g., TRX). In an OFF state, the switch 114 needs to withstand the high input power levels (e.g., over 40 dBm) generally associated with transmitting wireless communications signals. In the OFF state, the relatively high input voltage is spread out among the individual devices in the stack of the switch 114, reducing the voltage across each individual device, in order to prevent breakdown. Stacking the devices is important because the drain-to-source breakdown voltage ($BV_{DS}$) and the drain-to-gate breakdown voltage ($BV_{DG}$) of a single FET may be on the order of 2 to 4 volts (V) (3.5V typically) depending on the particular process technology.

In an example, an output of a transmit chain may be coupled to a first terminal of the series transmit switch 110 and a first terminal of the shunt transmit switch 112. A second terminal of the series transmit switch 110 may be coupled to the RF common port (TRX) and a first terminal of the series receive switch 114. In an example, the RF common port TRX may be connected to an antenna or a transmission line. A second terminal of the series receive switch 114 may be coupled to a first terminal of the shunt receive switch 116 and the RF output port RX. In an example, an input of a receive chain may be coupled to the RF output port RX. A second terminal of the shunt transmit switch 112 and a second terminal of the shunt receive switch 116 may be coupled to a circuit ground potential.

A high power RF switch generally utilizes a high number of stacked devices. Because of the high number of stacked devices, traditional high power SOI switches use a large die area. The traditionally configured high power switch generally has negative effects through substrate loss and parasitic substrate capacitance due to the large device size and high stacking. Due to large gate capacitance, fast switching time (e.g., <0.5 microsecond) is hard to implement with traditionally configured switches without degradation of insertion loss. Applications with traditionally configured switches may involve a trade-off between insertion loss and fast switching time through gate resistance. Obtaining a good return loss is also difficult due to large parasitic substrate capacitance.

In an example, the RF input port may be connected to an output end of a transceiver transmit chain and the RF output port RX may be connected to an input end of a transceiver receive chain. In a transmit mode, the series transmit switch 110 is in a conducting state (e.g., closed or ON), the shunt transmit switch 112 is in a non-conducting state (e.g., open or OFF), the series receive switch 114 is in a non-conducting state (e.g., open or OFF), and the shunt receive switch 116 is in a conducting state (e.g., closed or ON). In a receive mode, the series transmit switch 110 is in a non-conducting state (e.g., open or OFF), the shunt transmit switch 112 is in a conducting state (e.g., closed or ON), the series receive switch 114 is in a conducting state (e.g., closed or ON), and the shunt receive switch 116 is in a non-conducting state (e.g., open or OFF). Because of the magnitude of the transmit power, the series receive switch 114 generally needs to have a high breakdown rating to isolate the receive chain during the transmit mode. Because the series receive switch 114 is directly in the signal path of the receive chain, the series receive switch 114 directly contributes to insertion loss (IL) and noise figure (NF) ratings of the receiver input.

Figure 3:
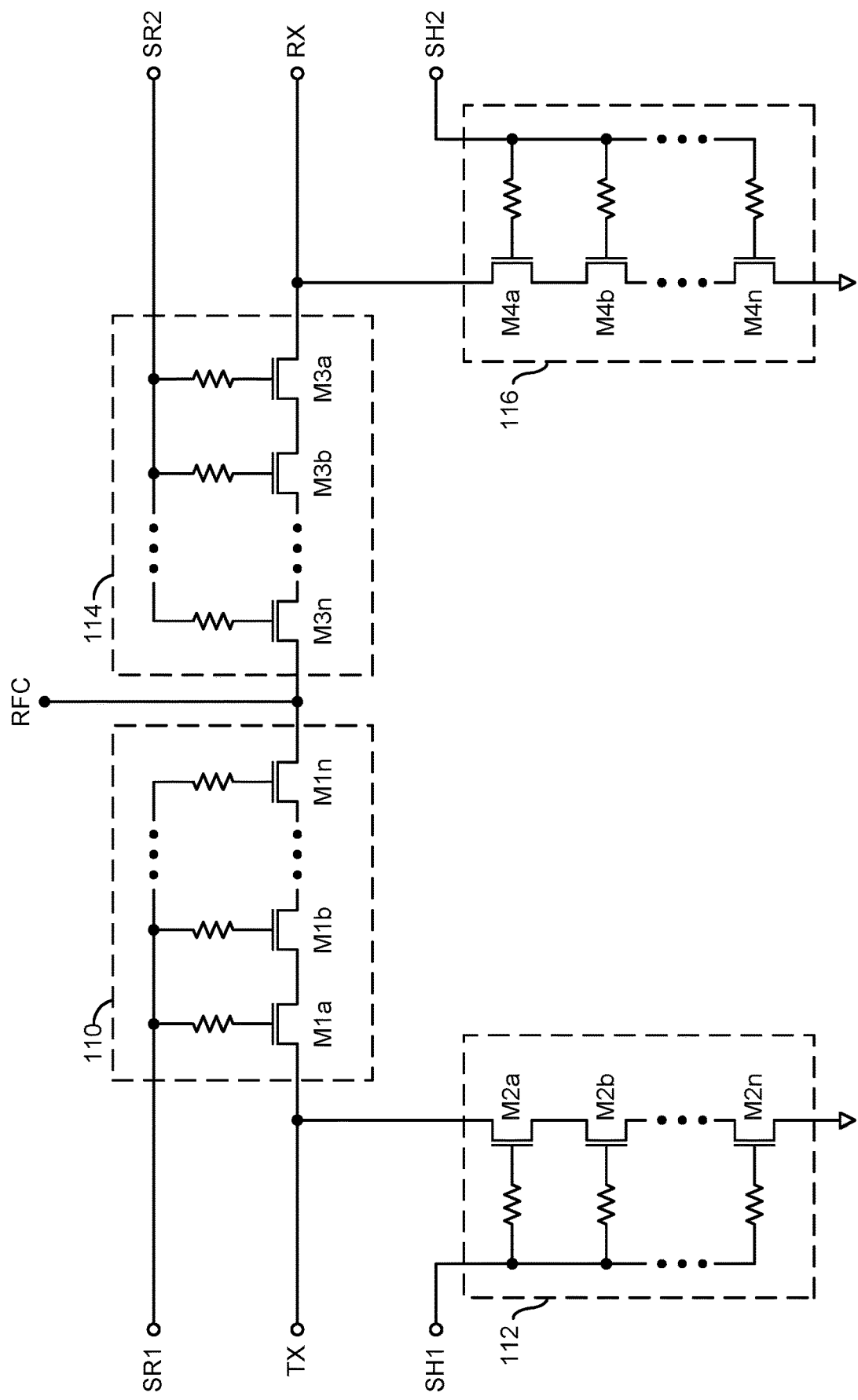
FIG. 3 is a diagram illustrating switch arms of the RF switch of FIG. 2.

Referring to FIG. 3, a schematic diagram is shown illustrating an example of a stacked device implementation of the high power switch of FIG. 1. In various embodiments, each of the switches 110, 112, 114, and 116 may be implemented as a number of devices (e.g., transistors) stacked in series. In an example, the switch 110 may comprise a number of transistors M1a-M1n, the switch 112 may comprise a number of transistors M2a-M2n, the switch 114 may comprise a number of transistors M3a-M3n, and the switch 116 may comprise a number of transistors M4a-M4n. In an example, the switches 110, 112, 114, and 116 may be implemented as stack-of-24 (So24) devices (e.g., n=24). In an example, the So24 devices may handle a maximum 44 dBm input power.

Field effect transistors (FETs) are typically used in cellular applications to meet low power demands of cellular applications. To handle the relatively high (e.g., tens of volts) RF voltages, the FETs making up the switches 110, 112, 114, and 116 are typically stacked. The term stacked is used to describe a configuration where the drain of one transistor is the source of the next transistor.

In an example, the relatively high input voltage is spread out among the individual devices in the stack of the switches 110, 112, 114, and 116, reducing the voltage across each individual device, in order to prevent breakdown. Stacking the devices of the traditional configuration is important because the drain-to-source breakdown voltage ($BV_{DS}$) and the drain-to-gate breakdown voltage ($BV_{DG}$) of a single FET may be on the order of 2 to 4 volts (V) (3.5V typically) depending on the particular process technology, while the RF signals may be on the order of 20 or more volts. The individual transistors of each stack may also be configured to more evenly distribute the RF voltage. By stacking the devices, the relatively high voltage typically used in most RF front-end modules is dispersed over several (e.g., typically twelve or more), so that the voltage across any one device is relatively small, making breakdown unlikely. Ideally, each of the devices in the stack should have substantially the same drain-to-source voltage.

In an example, each of the switches 110, 112, 114, and 116 receives a control signal (e.g., SR1, SH1, SR2, and SH2, respectively). When the respective control signal is held LOW, the corresponding switch is generally in a non-conducting state (e.g., open or OFF), blocking signals from passing through. When the respective control signal is held HIGH, the corresponding switch is generally in a conducting state (e.g., closed or ON), allowing the signals to pass through. In an example, when the control signals SR1 and SH2 are held HIGH and the control signals SR2 and SH1 are held LOW, the series transmit switch 110 allows signals to pass from the RF input port TX to the common RF port TRX and the shunt receive switch 116 directs signals to ground. When the control signals SR1 and SH2 are held LOW and the control signals SR2 and SH1 are held HIGH, the series receive switch 114 allows signals to pass from the RF common port TRX to the RF output port RX and the shunt transmit switch 112 directs signals to ground.

In some embodiments, the switches 110 and 116 may receive a first control signal and the switches 112 and 114 may receive a second control signal. In various embodiments, the signals SR1, SH1, SR2, SH2 may be derived from a single transmit/receive (T/R) control signal. In an example, a transmit mode may have the signal T/R held HIGH, resulting in the control signals SR1 and SH2 being held HIGH and the control signals SR2 and SH1 being held LOW. In another example, a receive mode may have the signal T/R held LOW, resulting in the control signals SR1 and SH2 being held HIGH and the control signals SR2 and SH1 being held LOW. However, other polarities may be implemented to meet design criteria of a particular implementation.

A typical antenna switch needs a high breakdown voltage (e.g., up to 30V swing) due to a combination of high power and mismatch at the antenna. To withstand such high voltages, multiple FETs are stacked to form a switch arm. For example, the switches 110 and 112 form a transmit arm of the switch 100 and the switches 114 and 116 form a receive arm of the switch 100. Due to substrate loss, the capability of stacked FETs has diminishing marginal improvement as more and more FETs are stacked into a switch arm. Also, as more FETs are stacked, increasing parasitic capacitance actually degrades the overall switch performance.

Switches are designed in series-shunt configuration, where series arms provide a low resistance path for the RF signal between the ON ports, and shunt arms provide a low resistance path for the RF power that leaks to the OFF ports. For switches with a high throw count, large parasitic capacitance of OFF arms provides a leakage path for the RF signal, which translates into signal loss and/or insertion loss for the ON arm. This effect can impose a severe limitation on throw count for technologies with higher RON*COFF.

The switches 114 and 116 are generally implemented by large numbers of series connected stacked devices. In an example, each of the switches 114 and 116 may be implemented as a stack of 24 devices (e.g., transistors). In an example, the stack of 24 devices may handle a maximum 44 dBm input power. In an OFF state, the large number of stacked devices is needed to withstand the high input power (e.g., over 40 dBm) generally associated with transmitters. The relatively high input voltage is spread out among the individual devices in the stack, reducing the voltage across each individual device, preventing breakdown. Stacking the devices is important because the drain-to-source breakdown voltage ($BV_{DS}$) and the drain-to-gate breakdown voltage ($BV_{DG}$) of a single FET may be on the order of 2 to 4 volts depending on the particular process technology.

In addition to withstanding the high input power in the OFF state, the stacked devices need to provide good isolation and good frequency response/bandwidth (low COFF). High COFF degrades overall frequency response/bandwidth of a system. The stacked devices in accordance with embodiments of the invention are generally configured to minimize or avoid juxtaposition of the source and drain electrodes to minimize the parasitic capacitances of the OFF arms (off-capacitance or COFF). SOI technology involves placing an insulation layer beneath the field effect transistor (FET) channel. The insulation layer limits the space of the channel. The insulation layer also limits any current flow around the depletion region when the transistor is in the non-conducting (OFF) state. The insulator restricts the current to the space directly between the drain and source wells. The current restriction allows for an extremely high ROFF when compared to regular FET technology, and increases isolation as well.

The devices making up the switches 114 and 116 are generally configured to minimize parasitic source-drain capacitance ($C_{SD}$) to minimize the amount of the input radio signal that leaks through the switch in the non-conducting (OFF) state. Part of the source-drain capacitance in the devices making up the switches 114 and 116 is contributed by capacitance between metal conductors forming the source and drain connections. In various embodiments, the source-drain capacitance between the metal source and drain conductors is adjusted by varying the configuration of the metal layer and via layer source/drain connections.

Figure 4:
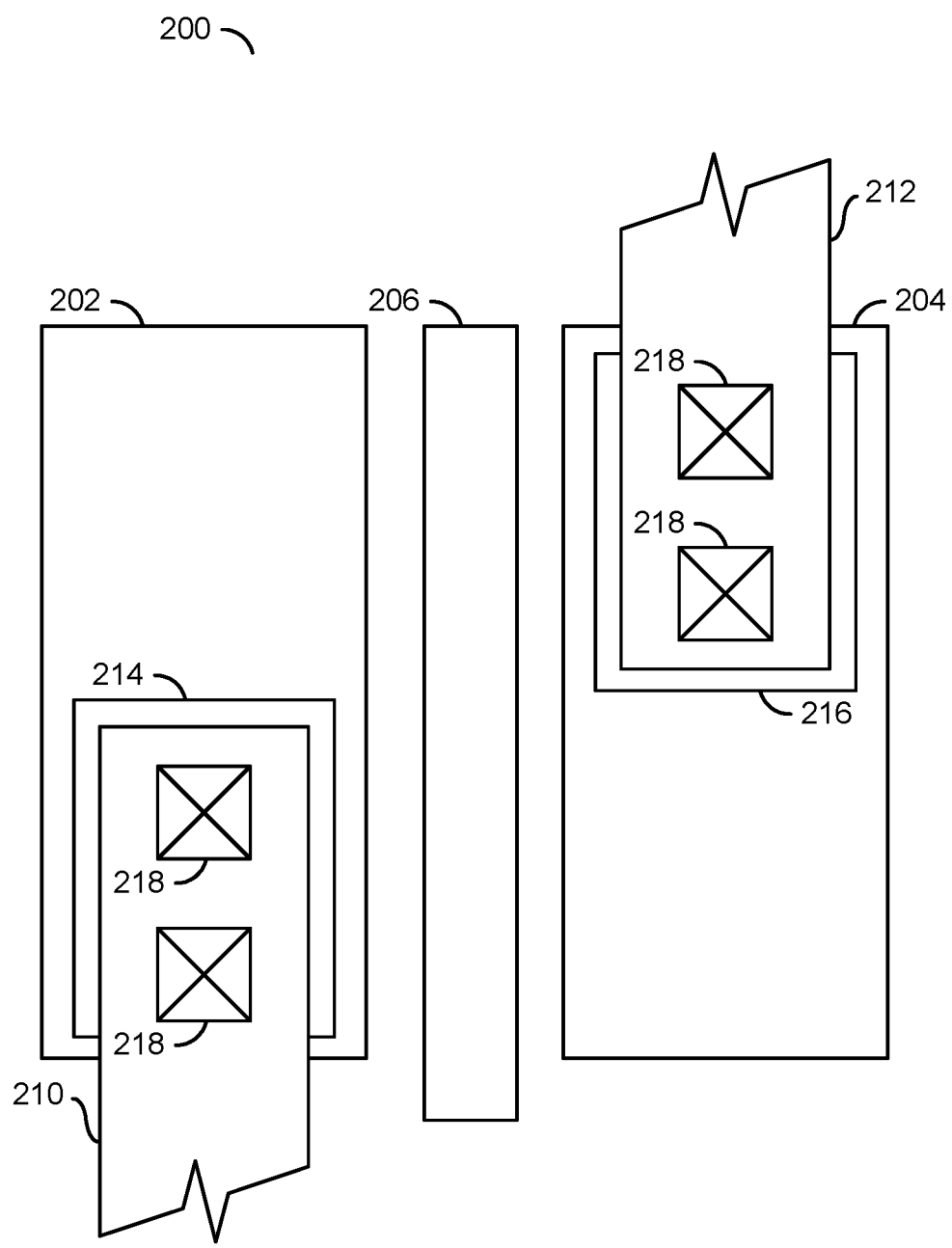
FIG. 4 is a diagram illustrating a field effect transistor layout in accordance with an example embodiment of the invention.

Referring to FIG. 4, a diagram of a transistor layout 200 is shown illustrating a source-drain configuration in accordance with an example embodiment of the invention. In an example, the transistor layout 200 comprises a source diffusion 202, a drain diffusion 204, and a gate disposed above a channel between the source and drain diffusions. A source conductor 210 is formed in a metal layer (e.g., M1) partially overlapping the source diffusion 202. A drain conductor 212 is formed in the metal layer (e.g., M1) partially overlapping the drain diffusion 204. An ohmic region 214 of the source diffusion 202 and an ohmic region 216 of the drain diffusion 204 are connected to the source conductor 210 and the drain conductor 212, respectively, by a number of vias 218. In contrast to convention field effect transistor layout, the source conductor 210 and the drain conductor 212 are configured to avoid any juxtaposition with one another. The configuration of the source conductor 210 and the drain conductor 212 maximizes the separation between the source conductor 210 and the drain conductor 212 (and the respective vias 218), reducing the source-drain capacitance component attributable to the source and drain conductors.

Figure 5:
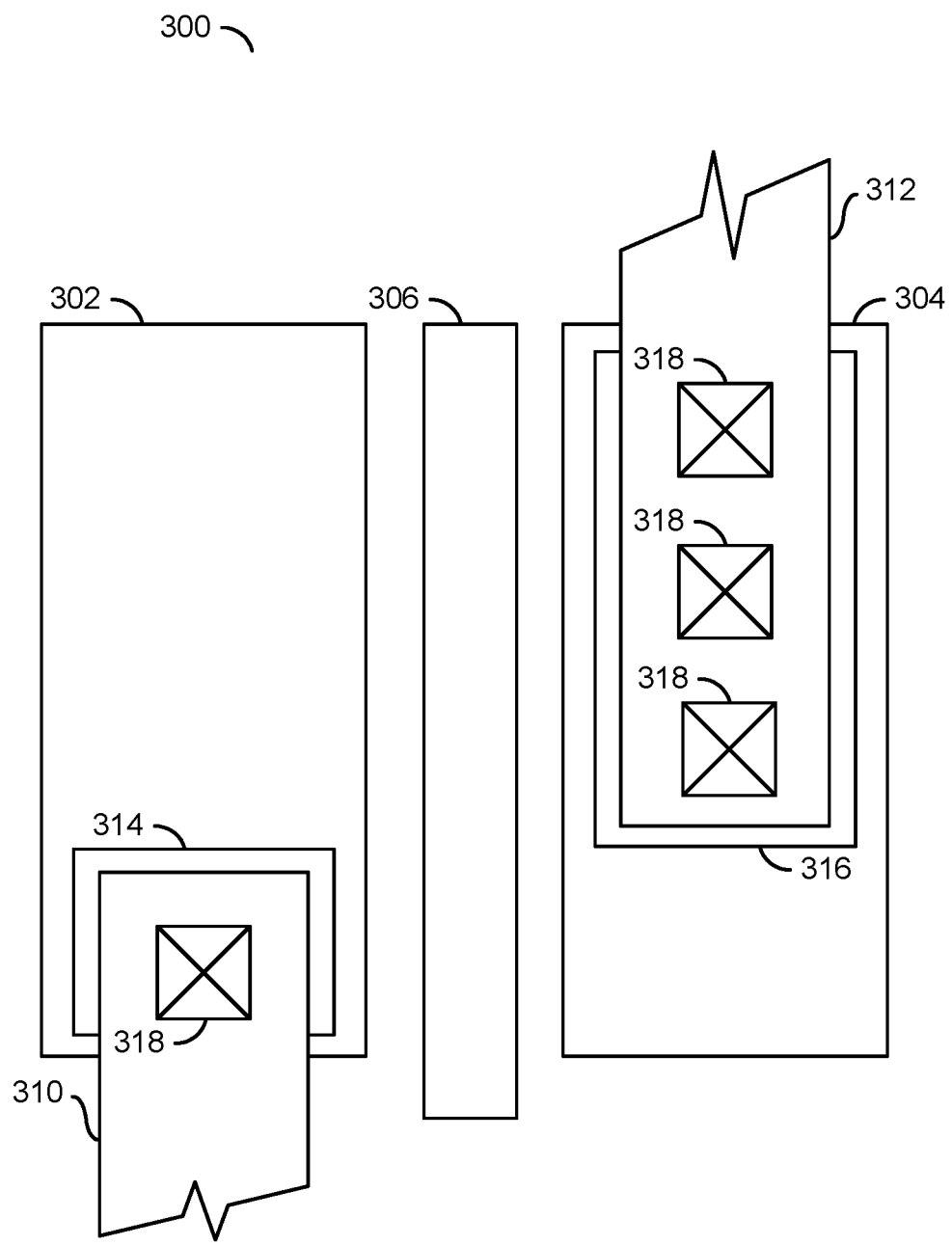
FIG. 5 is a diagram illustrating another field effect transistor layout in accordance with an example embodiment of the invention.

Referring to FIG. 5, a diagram of a transistor layout 300 is shown illustrating another source-drain configuration in accordance with an example embodiment of the invention. In another example, the transistor layout 300 comprises a source diffusion 302, a drain diffusion 304, and a gate disposed above a channel between the source and drain diffusions. A source conductor 310 is formed in a metal layer (e.g., M1) partially overlapping the source diffusion 302. A drain conductor 312 is formed in the metal layer (e.g., M1) partially overlapping the drain diffusion 304. An ohmic region 314 of the source diffusion 302 and an ohmic region 316 of the drain diffusion 304 are connected to the source conductor 310 and the drain conductor 312, respectively, by a number of vias 318. The source conductor 310 and the drain conductor 312 may still be configured to avoid any juxtaposition with one another. However, instead of being of equivalent length, the source conductor 310 may have a first length and the drain conductor 312 may have a second length, different from the first length. In an example, instead of the source conductor 310 and the drain conductor 312 each covering 50% of the long axis of the source diffusion 302 and the drain diffusion 304, respectively, some other ratio (e.g., 25%/75%, 33%/67%, 75%/25%, 67%/33%, etc.) may be implemented depending upon particular design criteria of the particular application. The configuration of the source conductor 310 and the drain conductor 312 generally maximizes the separation between the source conductor 310 and the drain conductor 312 (and the respective vias 318), reducing the source-drain capacitance component attributable to the source and drain conductors.

Figure 6:
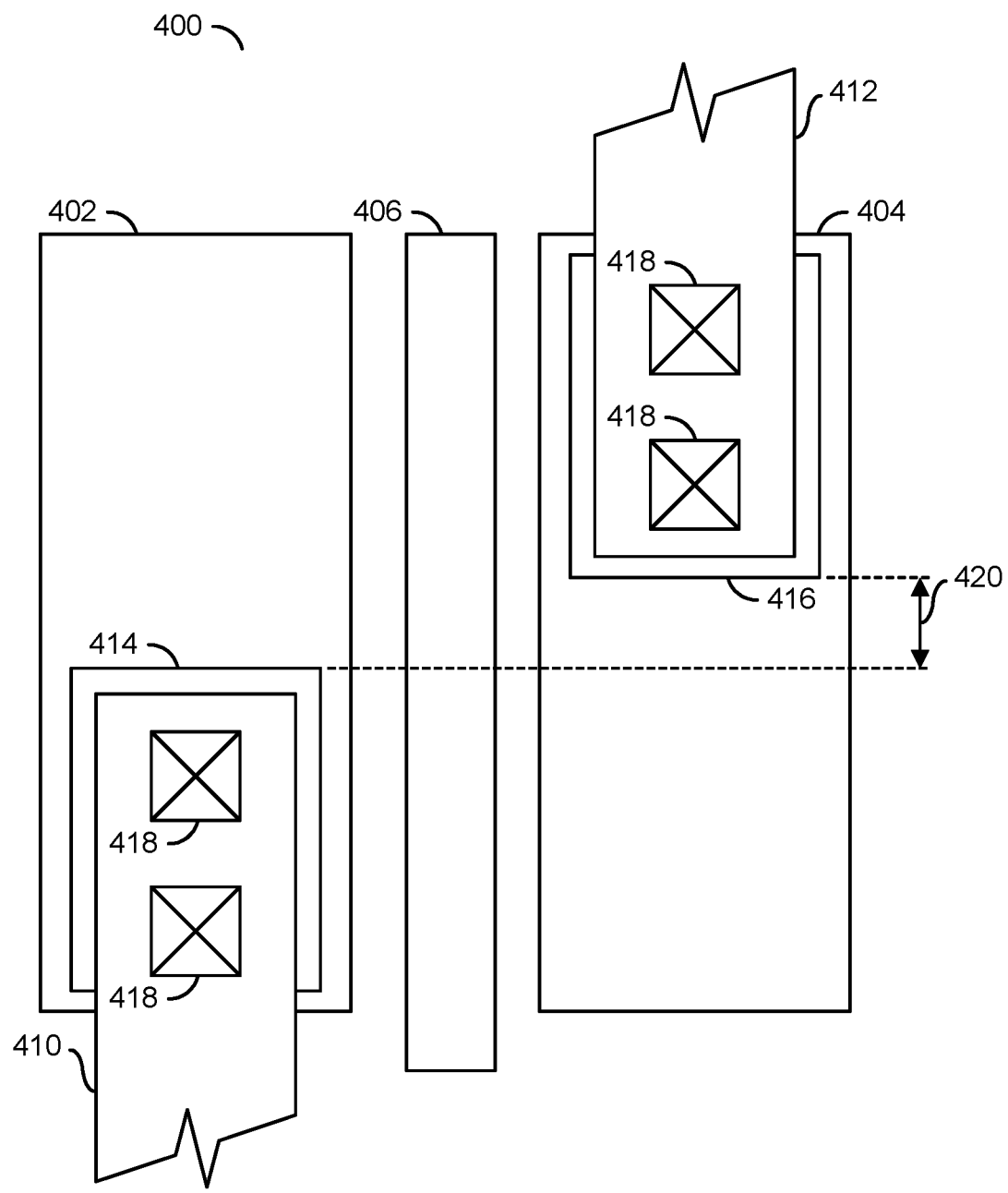
FIG. 6 is a diagram illustrating yet another field effect transistor layout in accordance with an example embodiment of the invention.

Referring to FIG. 6, a diagram of a transistor layout 400 is shown illustrating yet another source-drain configuration in accordance with an example embodiment of the invention. In another example, the transistor layout 400 comprises a source diffusion 402, a drain diffusion 404, and a gate 406 disposed above a channel between the source diffusion 402 and the drain diffusion 404. A source conductor 410 is formed in a metal layer (e.g., M1) partially overlapping the source diffusion 402. A drain conductor 412 is formed in the metal layer (e.g., M1) partially overlapping the drain diffusion 404. An ohmic region 414 of the source diffusion 402 and an ohmic region 416 of the drain diffusion 404 are connected to the source conductor 410 and the drain conductor 412, respectively, by a number of vias 418. The source conductor 410 and the drain conductor 412 may be further configured to avoid any juxtaposition with one another by a gap 420 between ends of the source conductor 410 and the drain conductor 412. In various embodiments, the gap 420 may be implemented with the source conductor 410 and the drain conductor 412 having similar or different respective lengths. In an example, instead of the source conductor 410 and the drain conductor 412 may each cover the long axis of the source diffusion 402 and the drain diffusion 404, respectively, by some ratio (e.g., 50%/50%, 25%/75%, 33%/67%, 75%/25%, 67%/33%, etc.), less the length of the gap 420. The configuration of the source conductor 410 and the drain conductor 412 generally maximizes the separation between the source conductor 410 and the drain conductor 412 (and the respective vias 418), reducing the source-drain capacitance component attributable to the source and drain conductors.

Figure 7:
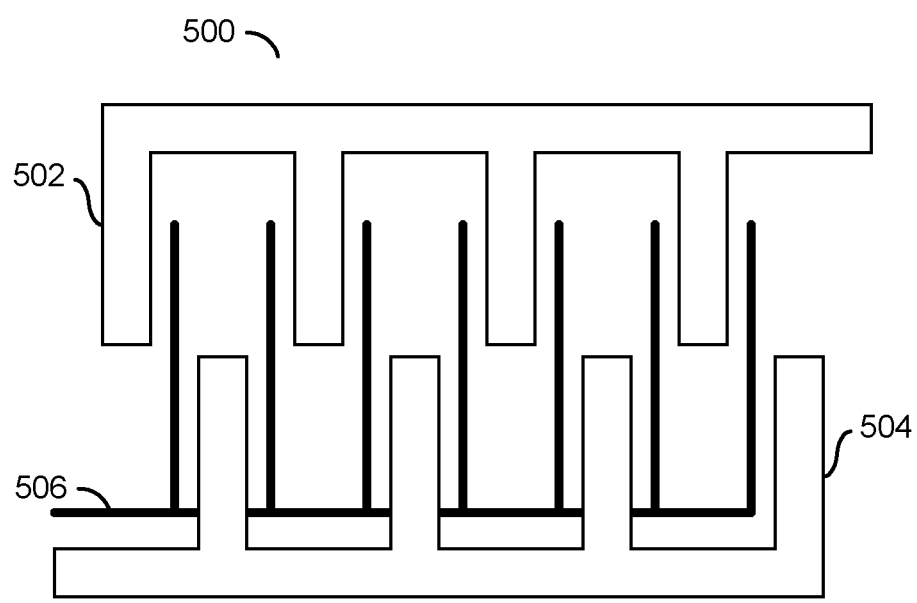
FIG. 7 is a diagram illustrating a multi-finger field effect transistor layout in accordance with an example embodiment of the invention.

Referring to FIG. 7, a diagram of a transistor layout 500 is shown illustrating a multi-finger field effect transistor layout in accordance with an example embodiment of the invention. The transistors in RF switches are generally expected to sustain a significant amount of current. In an example, the transistors in the RF switch may be distributed over an area of a circuit wafer in a multi-finger layout. In an example, the transistor layout 500 comprises a multi-finger source conductor 502 formed in a metal layer (e.g., M1) partially overlapping source diffusions, a multi-finger drain conductor 504 formed in the metal layer (e.g., M1) partially overlapping drain diffusions, and a multi-finger gate 506 disposed above a channel between the source and drain diffusions. An ohmic region of the source diffusions and an ohmic region of the drain diffusions are connected to the fingers of the source conductor 502 and the fingers of the drain conductor 504, respectively, by a number of vias (as illustrated in FIGS. 3-6). The fingers of the source conductor 502 and the drain conductor 504 are generally configured to avoid any juxtaposition with one another. The fingers of the source conductor 502 and the drain conductor 504 are laid out in an alternating basis. The multi-finger transistor generally operates like a set of many smaller transistors in parallel, providing an effective transistor width that is greater than the transistor length.

Although embodiments of the invention may have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, etc.) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   one or more field effect transistors configured as a switch;
   each of the one or more field effect transistors comprises one or more source diffusions, one or more drain diffusions, and one or more gate fingers;
   each of the one or more gate fingers is disposed between a source diffusion and a drain diffusion;
   a first electrical connection is made to the one or more source diffusions using one or more source electrodes that extend from a first end for a first length along a long axis of the one or more source diffusions;
   a second electrical connection is made to the one or more drain diffusions using one or more drain electrodes that extend from a second end for a second length along a long axis of the drain diffusions; and
   the first length of the one or more source electrodes and the second length of the one or more drain electrodes are selected to avoid juxtaposition of the one or more source electrodes and the one or more drain electrodes.

2. The apparatus according to claim 1, wherein said switch is a transmit-receive switch.

3. The apparatus according to claim 1, wherein said switch comprises at least one pole and at least one throw.

4. The apparatus according to claim 1, wherein said first length and said second length are approximately one-half of a length of the long axis of the source diffusion and the long axis of the drain diffusion, respectively.

5. The apparatus according to claim 1, wherein said first length and said second length are different percentages of the length along the respective long axes.

6. The apparatus according to claim 1, wherein ends of said source electrodes and said drain electrodes are separated from one another relative to the long axes of the respective diffusions by a predetermined gap.

7. The apparatus according to claim 1, wherein said switch is implement utilizing a silicon-on-insulator (SOI) process.

8. The apparatus according to claim 1, wherein said switch is implemented utilizing a CMOS fabrication process on bulk silicon.

9. The apparatus according to claim 1, further comprising:
   a transmitter circuit; and
   a receiver circuit, wherein an output of said transmitter circuit is coupled to an input port of said switch, an output port of said switch is coupled to an input of said receiver circuit, and a common port of said switch is coupled to at least one of an antenna or a transmission line.

10. The apparatus according to claim 1, wherein said one or more transistors are implemented with a multi-finger layout.

11. A method of boosting RON*COFF performance comprising:
    forming a source diffusion, a drain diffusion, and a channel region on an integrated circuit substrate, wherein the channel region is located between the source and the drain diffusions;
    forming a gate above said channel region;
    forming a source electrode in a metal layer above said integrated circuit substrate, wherein said source electrode extends from a first end for a first length along a long axis of said source diffusion and is connected to said source diffusion by one or more vias;
    forming a drain electrode in said metal layer above said integrated circuit substrate, wherein said drain electrode extends from a second end for a second length along a long axis of said drain diffusion and is connected to said drain diffusion by one or more vias; and
    wherein the first length of said source electrode and the second length of said drain electrode are configured to avoid a juxtaposition of said source electrode and said drain electrode.

12. The method according to claim 11, wherein said source electrode and said drain electrode are approximately equivalent in length.

13. The method according to claim 11, wherein said source electrode and said drain electrode have different lengths.

14. The method according to claim 11, wherein ends of said source electrode and said drain electrode are separated from one another relative to the long axes of the respective diffusions by a predetermined gap.

15. The method according to claim 11, wherein said forming steps are repeated to implement a multi-finger transistor layout.

* * * * *